US009628071B2

(12) United States Patent
Jang et al.

(10) Patent No.: US 9,628,071 B2
(45) Date of Patent: Apr. 18, 2017

(54) POWER-ON RESET CIRCUIT AND DISPLAY DEVICE USING POWER-ON RESET CIRCUIT

(71) Applicant: Samsung Electronics Co., Ltd., Suwon-si, Gyeonggi-do (KR)

(72) Inventors: EunJong Jang, Osan-si (KR); Yong-Hun Kim, Seoul (KR); Myoungsik Suh, Hwaseong-si (KR); Jae-Bum Lee, Gwangmyeong-si (KR); SooJin Park, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 172 days.

(21) Appl. No.: 14/228,865

(22) Filed: Mar. 28, 2014

(65) Prior Publication Data

US 2014/0300593 A1 Oct. 9, 2014

(30) Foreign Application Priority Data

Apr. 4, 2013 (KR) ........................ 10-2013-0036877

(51) Int. Cl.

| | |
|---|---|
| ***G09G 5/00*** | (2006.01) |
| ***H03K 17/22*** | (2006.01) |
| ***G06F 1/24*** | (2006.01) |
| ***G09G 3/20*** | (2006.01) |

(52) U.S. Cl.

CPC ............. *H03K 17/223* (2013.01); *G06F 1/24* (2013.01); *G09G 3/20* (2013.01); *G09G 5/003* (2013.01); *G09G 2310/0267* (2013.01); *G09G 2310/0275* (2013.01); *G09G 2330/026* (2013.01)

(58) Field of Classification Search

None

See application file for complete search history.

(56) References Cited

U.S. PATENT DOCUMENTS

| | | | |
|---|---|---|---|
| 6,972,602 | B2 | 12/2005 | Akamatsu et al. |
| 7,348,817 | B2 | 3/2008 | Laio et al. |
| 7,589,574 | B2 | 9/2009 | Zhu et al. |
| 7,821,307 | B2 | 10/2010 | Chellappa |

(Continued)

FOREIGN PATENT DOCUMENTS

| | | |
|---|---|---|
| JP | 2008-054091 | 3/2008 |
| JP | 2011-024064 | 2/2011 |

(Continued)

*Primary Examiner* — Christopher R Lamb

(74) *Attorney, Agent, or Firm* — Muir Patent Law, PLLC

(57) ABSTRACT

A power-on reset circuit includes a voltage detector unit to output an electrical signal in response to a power supply voltage received from a power supply terminal, an inverter to output a reset signal according to a level of the electrical signal from the voltage detector unit, a first switch unit to be turned on or off in response to the reset signal from the inverter; a first discharge unit to discharge the electrical signal in response to the power supply voltage from the first switch unit, a second switch unit to be turned on according to a start pulse signal from an external device and to receive the power supply voltage from the power supply terminal, and a second discharge unit to discharge the electrical signal in response to the power supply voltage from the second switch.

16 Claims, 9 Drawing Sheets

(56) References Cited

U.S. PATENT DOCUMENTS

| | | | | |
|---|---|---|---|---|
| 8,319,769 | B2 | 11/2012 | Lee et al. | |
| 2002/0109535 | A1* | 8/2002 | Caliboso | H03K 17/223 327/143 |
| 2002/0145599 | A1* | 10/2002 | Endo | G09G 3/3611 345/211 |
| 2005/0104635 | A1* | 5/2005 | Sekino | H03K 17/223 327/143 |
| 2006/0109037 | A1* | 5/2006 | Hsu | H03K 17/302 327/143 |
| 2009/0167746 | A1 | 7/2009 | Yoon | |
| 2011/0012651 | A1 | 1/2011 | Kaidoh et al. | |
| 2011/0199397 | A1* | 8/2011 | Ko | G09G 3/3688 345/690 |
| 2012/0176167 | A1 | 7/2012 | Lee et al. | |

FOREIGN PATENT DOCUMENTS

| | | |
|---|---|---|
| KR | 20-1993-0016703 | 7/1993 |
| KR | 10-2003-0002176 | 1/2003 |
| KR | 10-0922927 | 10/2009 |
| KR | 10-2012-0081515 | 7/2012 |

* cited by examiner 500
530
Display Panel
520
Data Driver
DL1
DL2
DLn
GL1
GL2
GLn
510
Gate Driver
511
POR Circuit
540
Timing Controller
Start Pulse 600
630
Display Panel
620
621
POR Circuit
Data Driver
DLn
DL2
DL1
GL1
GL2
GLn
610
Gate Driver
Start Pulse
640
Timing Controller

POWER-ON RESET CIRCUIT AND DISPLAY DEVICE USING POWER-ON RESET CIRCUIT

CROSS-REFERENCE TO RELATED APPLICATIONS

This application claims priority under 35 U.S.C. §119 from Korean Patent Application No. 10-2013-0036877 filed Apr. 4, 2013, in the Korean Intellectual Property Office, the entire contents of which are herein incorporated by reference.

BACKGROUND

1. Field

The present general inventive concept described herein relates to a semiconductor integrated circuit, and more particularly, to a display device including a power-on reset circuit.

2. Description of the Related Art

A conventional power-on reset circuit generates a reset signal to reset an operation of a display device when a power supply voltage reaches a predetermined minimum voltage level. The conventional power-on reset circuit protects an unexpected error of a system due to an initial voltage variation. The conventional power-on reset circuit is designed to maintain the reset signal until the power supply voltage reaches a voltage level sufficient to stably drive a system.

Also, a leakage current may arise at the conventional power-on reset circuit according to a strong light applied from the outside or an external apparatus. As the leakage current arises, the conventional power-on reset circuit may continue to generate the reset signal.

SUMMARY

The present general inventive concept provides a power-on reset circuit to control a reset signal RST in response to a start pulse signal SP, such that a display device operates normally although a strength of external light received from outside or an external device is strong.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a power-on reset circuit including a voltage detector unit to output an electrical signal in response to a power supply voltage received from a power supply terminal, an inverter to output a reset signal according to a level of the electrical signal from the voltage detector unit, a first switch unit to be turned on or off in response to the reset signal from the inverter, a first discharge unit to discharge the electrical signal in response to the power supply voltage from the first switch unit, a second switch unit to be turned on according to a start pulse signal from an external device and to receive the power supply voltage from the power supply terminal, and a second discharge unit to discharge the electrical signal in response to the power supply voltage from the second switch.

The first switch unit may include a first PMOS transistor connected between the power supply terminal and the first discharge unit and having a gate connected to an output terminal of the inverter.

The PMOS transistor may be turned on when the reset signal is activated and may be turned off when the reset signal is inactivated.

The first discharge unit may include a current mirror to discharge the electrical signal in response to the power supply voltage from the first switch unit.

The current mirror may include a source unit to generate a first current in response to the power supply voltage from the first switch unit, and a first NMOS transistor to discharge the electrical signal in response to the first current.

The second discharge unit may include a second NMOS transistor to discharge the electrical signal in response to the power supply voltage from the second switch unit, and wherein a size of the second NMOS transistor is larger than that of the first NMOS transistor.

The second NMOS transistor may include a drain terminal connected to the voltage detector unit, a source terminal grounded, and a gate terminal connected to the second switch unit.

When a voltage level of the electrical signal applied to the inverter is higher than a threshold voltage level, the inverter may activate the reset signal.

The start pulse signal may be applied to the second switch unit after the reset signal output from the inverter is activated.

When the second switch unit is turned on in response to the start pulse signal, the power supply voltage may be applied to the output terminal of the inverter through the second switch unit.

The foregoing and/or other features and utilities of the present general inventive concept may be achieved by providing a display device which comprises a display panel, a gate driver electrically connected to the display panel and to apply a gate voltage to the display panel through a plurality of gate lines, a data driver electrically connected to the display panel and to apply a data voltage to the display panel through a plurality of data lines, a timing controller electrically connected to the gate driver and the data driver and to provide a start pulse signal to the gate driver, and a first power-on reset circuit included in the gate driver and to output a reset signal to reset the gate driver, wherein the first power-on reset circuit terminates an output of the reset signal in response to the start pulse signal.

The timing controller may apply the start pulse signal to the first power-on reset circuit after the reset signal is activated.

The timing controller may output a control signal needed to generate the gate voltage to the gate driver and outputs the start pulse signal to the gate driver as an initial signal of the control signal.

The data driver may include a second power-on reset circuit to output a reset signal to reset the data driver.

The second power-on reset circuit may stop outputting the reset signal in response to an input of the start pulse signal from the timing controller.

The foregoing and/or other features and utilities of the present general inventive concept may be achieved by providing a power-on reset circuit to activate a reset signal to reset a display device, the power-on reset circuit including an inverter to activate the reset signal in response to a received electrical signal corresponding to a power supply voltage, such that the display device is reset, a first switch unit to turn on in response to receiving the reset signal from the inverter, a first discharge unit to discharge the electrical signal in response to receiving the power supply voltage from the first switch unit, and a second discharge unit to receive the power supply voltage in response to a start pulse signal transmitted from an external device and to discharge the electrical signal to deactivate the reset signal.

The power-on reset circuit may further include a voltage detector unit to receive the power supply voltage from a power supply terminal and to output the electrical signal to a node connected to an input of the inverter.

The reset signal may be deactivated when a voltage level of the node is less than a threshold level.

The inverter may activate the reset signal when a voltage level of the received electrical signal is higher than a threshold voltage level.

The first discharge unit may receive the power supply voltage when the first switch unit is turned on.

The power-on reset circuit may further include a second switch unit to turn on in response to the start pulse signal received from the external device and to supply the power supply voltage to the second discharge unit.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
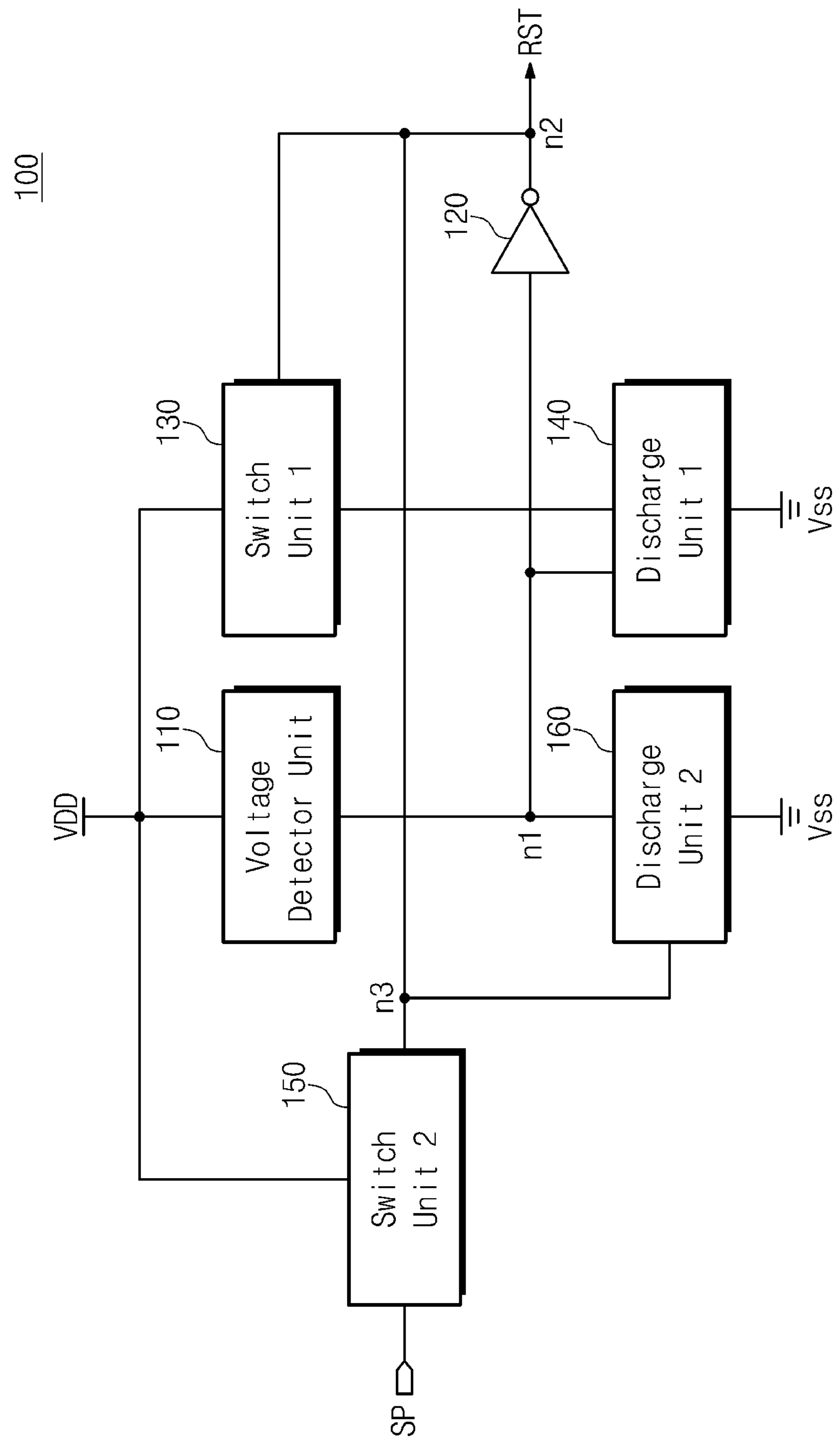
FIG. 1 is a block diagram schematically illustrating a power-on reset circuit according to an exemplary embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

It will be understood that, although the terms “first”, “second”, “third”, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as “beneath”, “below”, “lower”, “under”, “above”, “upper” and the like, may be used herein for ease of description to describe one element or feature’s relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as “below” or “beneath” or “under” other elements or features would then be oriented “above” the other elements or features. Thus, the exemplary terms “below” and “under” can encompass both an orientation of above and below. The device may be otherwise oriented (rotated 90 degrees or at other orientations) and the spatially relative descriptors used herein interpreted accordingly. In addition, it will also be understood that when a layer is referred to as being “between” two layers, it can be the only layer between the two layers, or one or more intervening layers may also be present.

The terminology used herein is for the purpose of describing particular embodiments only and is not intended to be limiting of the inventive concept. As used herein, the singular forms “a”, “an” and “the” are intended to include the plural forms as well, unless the context clearly indicates otherwise. It will be further understood that the terms “comprises” and/or “comprising,” when used in this specification, specify the presence of stated features, integers, steps, operations, elements, and/or components, but do not preclude the presence or addition of one or more other features, integers, steps, operations, elements, components, and/or groups thereof. As used herein, the term “and/or” includes any and all combinations of one or more of the associated listed items. Also, the term “exemplary” is intended to refer to an example or illustration.

It will be understood that when an element or layer is referred to as being “on”, “connected to”, “coupled to”, or “adjacent to” another element or layer, it can be directly on, connected, coupled, or adjacent to the other element or layer, or intervening elements or layers may be present. In contrast, when an element is referred to as being “directly on,” “directly connected to”, “directly coupled to”, or “immediately adjacent to” another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a power-on reset circuit 100 according to an exemplary embodiment of the present general inventive concept. Referring to FIG. 1, the power-on reset circuit 100 includes a voltage detector unit 110, an inverter 120, a first switch unit (a.k.a., switch unit 1) 130, a first discharge unit (a.k.a., discharge unit 1) 140, a second switch unit (a.k.a., switch unit 2) 150, and a second discharge unit (a.k.a., discharge unit 2) 160.

The voltage detector unit 110 is connected between a power supply terminal and a first node n1. The voltage detector unit 110 receives a power supply voltage VDD from the power supply terminal. The voltage detector unit 110 applies an electrical signal to the first node n1 according to the power supply voltage VDD.

The inverter 120 is connected between the first node n1 and a second node n2. An input terminal of the inverter 120 may be connected to the first node n1 to receive an electrical signal. An output terminal of the inverter 120 outputs a reset signal RST in response to the input electrical signal.

As illustrated in FIG. 1, the inverter 120 may activate the reset signal RST when a voltage level of the first node n1 is higher than a threshold voltage level. The second node n2 is used as an output terminal of the power-on reset circuit 100.

The first switch unit 130 is connected between the power supply terminal and the first discharge unit 140. The first switch unit 130 is turned on in response to the reset signal RST provided through the second node n2. When the first switch unit 130 is turned on, the power supply voltage VDD is applied to the first discharge unit 140 through the first switch unit 130.

The first discharge unit 140 is connected between the first switch unit 130 and a ground terminal Vss. The first discharge unit 140 receives the power supply voltage VDD through the first switch unit 130. The first discharge unit 140 discharges an electrical signal applied to the first node n1 in response to the power supply voltage VDD.

The second switch unit 150 is connected between the power supply terminal and the second node n2. The second switch unit 150 receives a start pulse signal SP from an external device. In exemplary embodiments of the present general inventive concept, the external device may be a timing controller used to control a display device. In exemplary embodiments of the present general inventive concept, the start pulse signal SP may be a clock signal applied to a gate driver or a data driver from the timing controller.

The second switch unit 150 is turned on in response to the start pulse signal SP. When the second switch unit 150 is turned on, the power supply voltage VDD is applied to a third node n3 and the second discharge unit 160 through the second switch unit 150.

The second discharge unit 160 is connected between the first node n1 and the ground terminal Vss. The second discharge unit 160 receives the power supply voltage VDD through the third node n3. The discharge unit 160 discharges an electrical signal applied to the first node n1 in response to the power supply voltage VDD. When the electrical signal applied to the first node n1 is discharged through the first and second discharge units 140 and 160, respectively, a voltage level of the first node n1 may be lowered.

In exemplary embodiments of the present general inventive concept, the inverter 120 may deactivate the reset signal RST when a voltage level of the first node n1 is lower than the threshold voltage level.

As described above, the power-on reset circuit 100 activates the reset signal RST to reset the display device. However, an application of the power-on reset circuit 100 is not limited to the display device.

Figure 2:
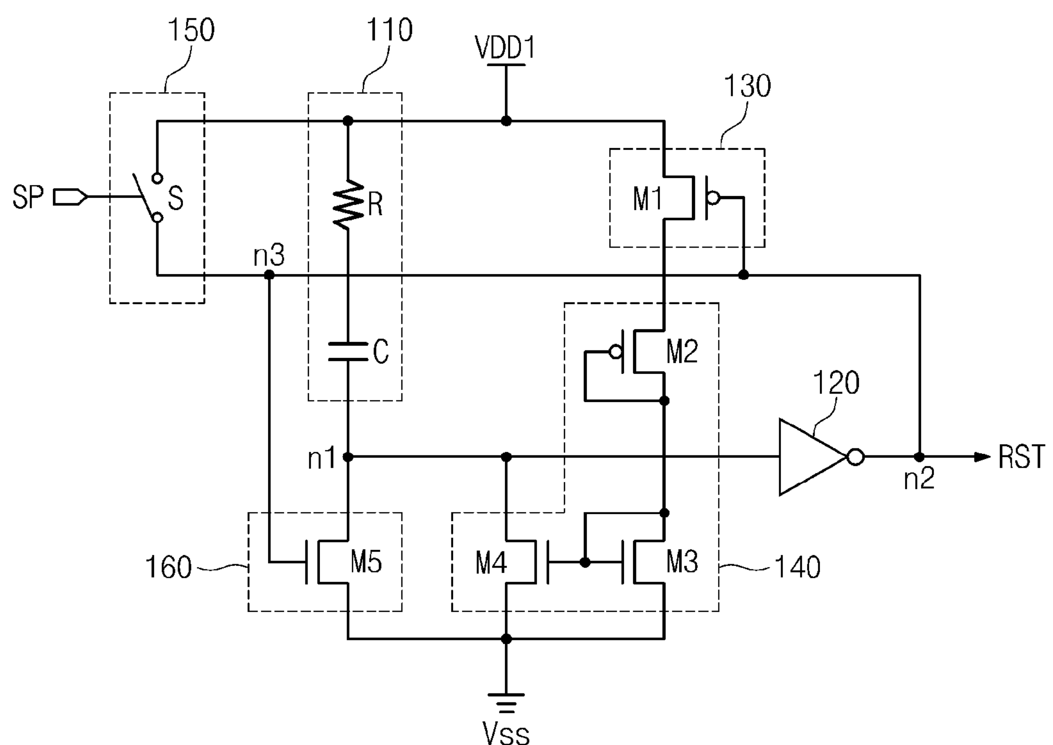
FIG. 2 is a circuit diagram schematically illustrating a power-on reset circuit according to an exemplary embodiment of the present general inventive concept.

FIG. 2 is a circuit diagram schematically illustrating the power-on reset circuit 100 according to an exemplary embodiment of the present general inventive concept. Referring to FIG. 2, a voltage detector unit 110 includes a resistor R and a capacitor C connected in series between a power supply terminal and a first node n1. The resistor R is connected to the power supply terminal to receive a power supply voltage VDD1. The capacitor C is connected to the first node n1 and outputs an electrical signal to the first node n1 according to a variation in a level of the first power supply voltage VDD1.

An inverter 120 is connected between the first node n1 and a second node n2 to receive a voltage of the first node n1. The inverter 120 activates a reset signal RST when a voltage level of the first node n1 is higher than a threshold voltage level.

A first switch unit 130 includes a first transistor M1 connected between the power supply terminal and a first discharge unit 140. The first transistor M1 may be a PMOS transistor. A source of the first transistor M1 is connected to the power supply terminal 102, and a drain thereof is connected to the first discharge unit 140. A gate of the first transistor M1 is connected to receive the reset signal RST from the inverter 120. The first transistor M1 operates in response to the reset signal RST.

For example, when the reset signal RST is activated, the first transistor M1 is turned on. When the reset signal RST is deactivated, the first transistor M1 is turned off. The reset signal RST activated may have a logically low state, and the reset signal RST deactivated may have a logically high state.

The first transistor M1 applies the first power supply voltage VDD1 to the first discharge unit 140 in response to the reset signal RST.

The first discharge unit 140 is connected between the first switch unit 130 and a ground terminal Vss. The first discharge unit 140 includes second through fourth transistors M2 through M4, respectively. The second transistor M2 is formed of a PMOS transistor, and the third and fourth transistors M3 and M4, respectively, are formed of an NMOS transistor, respectively.

A source of the second transistor M2 is connected to the drain of the first transistor M1, and a drain of the second transistor M2 is connected to a drain of the third transistor M3. A gate of the second transistor M2 is connected with its drain. The second transistor M2 acts as a diode. When the first transistor M1 is turned on, the first power supply voltage VDD1 is applied to the third transistor M3 through the second transistor M2.

The third and fourth transistors M3 and M4 operate as a current mirror. Conceptually, a current mirror is a circuit designed to copy a current through one active device by controlling the current in another active device of a circuit, keeping the output current constant regardless of loading. The current being 'copied' can be, and sometimes is, a varying signal current. Conceptually, an ideal current mirror is simply an ideal inverting current amplifier that reverses the current direction as well or it is a current-controlled current source (CCCS). The current mirror is used to provide bias currents and active loads to circuits.

The drain of the third transistor M3 is connected to the drain of the second transistor M2, and a source thereof is grounded. The gate of the third transistor M3 is connected with its drain. The fourth transistor M4 has a drain connected to the first node n1, a source grounded, and a gate connected to the gate of the third transistor M3.

The third transistor M3 is a source unit that generates a source current according to the first power supply voltage VDD1 applied from the first switch unit 130. The fourth transistor M4 is a discharge unit that generates a mirrored current of the source current and discharges an electrical signal through the mirrored current.

A voltage level provided from the second transistor M2 is applied to the drain and gate of the third transistor M3, respectively. Also, the voltage level provided from the second transistor M2 is applied to the gate of the fourth transistor M4, so that the fourth transistor M4 is turned on. Thus, an electrical signal applied to the first node n1 is discharged toward the ground terminal Vss through the fourth transistor M4.

A second switch unit 150 includes a switch S connected between the power supply terminal and the second node n2. The switch S operates in response to a start pulse signal SP applied from an external device. When the start pulse signal SP is applied, the switch S is turned on. At this time, the first power supply voltage VDD1 is applied to a second discharge unit 160 and the second node n2.

The second discharge unit 160 includes a fifth transistor M5 connected between the first node n1 and the ground terminal Vss. The fifth transistor M5 is an NMOS transistor. The fifth transistor M5 has a drain connected to the first node n1, a source grounded, and a gate connected to receive the first power supply voltage VDD1 through the switch S. The fifth transistor M5 discharges a voltage of the first node n1 in response to the first power supply voltage VDD1 applied.

In exemplary embodiments of the present general inventive concept, a size of the fifth transistor M5 may be larger than that of each of the first through fourth transistors M1 through M4, respectively. Thus, an amount of current discharged to the ground terminal Vss through the fifth transistor M5 may be greater than that discharged to the ground terminal Vss through the fourth transistor M4.

Figure 3:
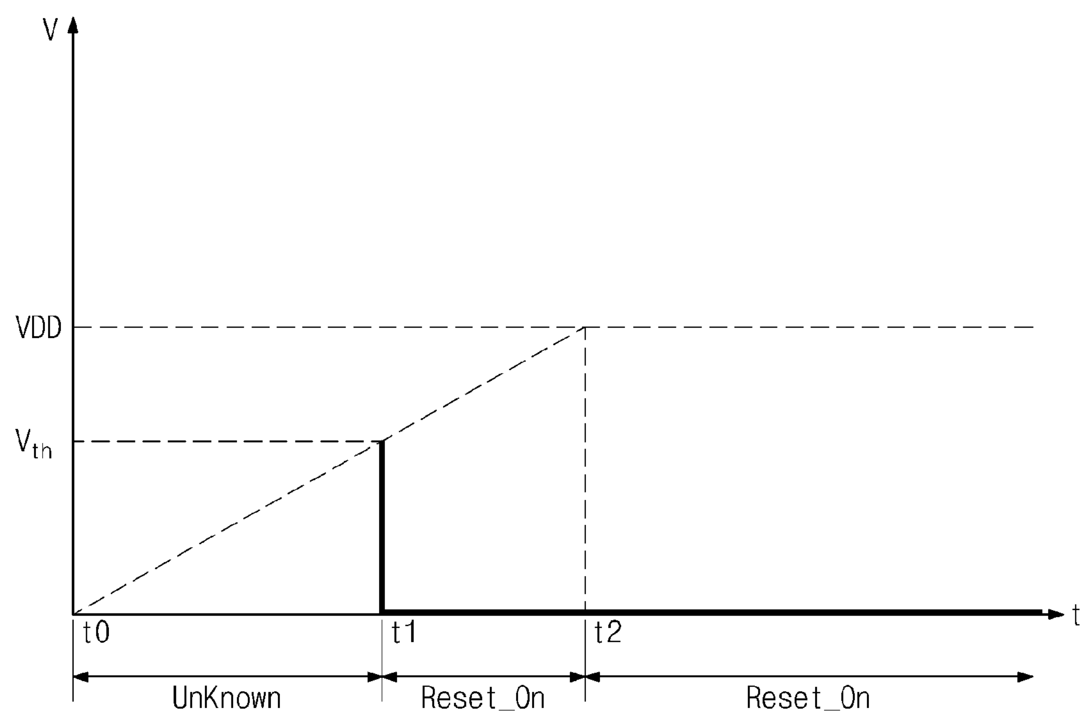
FIG. 3 is a timing diagram schematically illustrating an output value of a conventional power-on reset circuit.

FIG. 3 is a timing diagram schematically illustrating an output value of a conventional power-on reset circuit. Referring to FIGS. 2 and 3, a voltage level of a second node n2 between t0 and t1 may be unknown.

At t1 when a voltage level applied from the first node n1 to an inverter 120 exceeds a threshold voltage level $V_{th}$, the inverter 120 activates a reset signal RST. Thus, a second node n2 may be at a reset-on state. The reset-on state may mean such a state that the reset signal RST is activated.

As a voltage of the first node n1 is discharged through a first discharge unit 140, a voltage level of the first node n1 may be lowered. The inverter 120 deactivates the reset signal RST when a voltage level of the first node n1 is lower than the threshold voltage level $V_{th}$.

Also, a leakage current may be detected at a voltage detector unit 110 according to a strength of a light applied from the external device. When the leakage current generated from the voltage detector unit 110 is continuously applied to the first node n1, a voltage level of the first node n1 may not be lowered. Thus, the reset signal RST is continuously activated through the inverter 120.

With reference to FIG. 2 and as illustrated in FIG. 3, at t2, a leakage current is detected at the voltage detector unit 110 according to the strength of the light applied from the external device. When the leakage current generated from the voltage detector unit 110 is continuously applied to the first node n1, a voltage level of the first node n1 is not lowered. Thus, the reset signal RST is continuously activated through the inverter 120. That is, the system with regard to the conventional power-on reset circuit operates abnormally.

Figure 4:
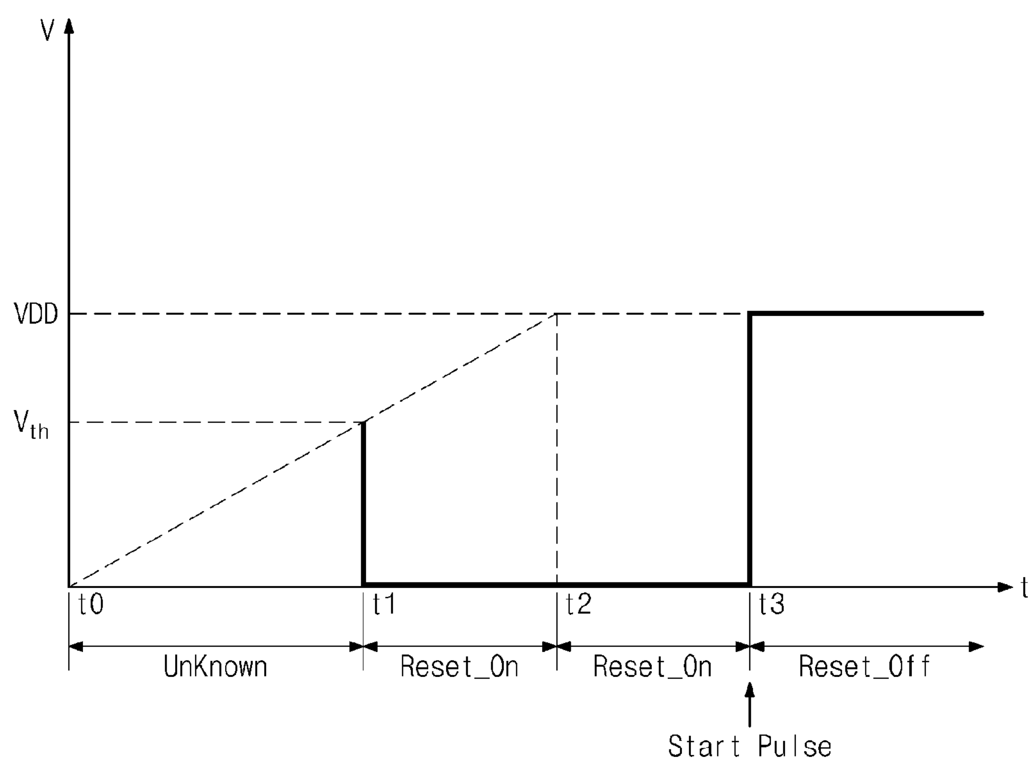
FIG. 4 is a timing diagram schematically illustrating an output of a power-on reset circuit according to an exemplary embodiment of the present general inventive concept.

FIG. 4 is a timing diagram schematically illustrating an output of the power-on reset circuit 100 according to an exemplary embodiment of the present general inventive concept. Referring to FIGS. 2 and 4, the power-on reset circuit 100 according to an exemplary embodiment of the present general inventive concept includes a second switch unit 150 to prevent an abnormal operation of a system due to a leakage current. When a reset signal RST is continuously activated through an inverter 120 at t2 as describe with reference to FIG. 3, the second switch unit 150 is turned on in response to a start pulse signal SP applied from an external device.

At t3 when the second switch unit 150 is turned on in response to the start pulse signal SP, a first power supply voltage VDD1 is applied to a second node n2. Also, as the second switch unit 150 is turned on, the first power supply voltage VDD1 is applied to a gate of a fifth transistor M5 included in a second discharge unit 160. The fifth transistor M5 discharges a voltage of the firs node n1 in response to the first power supply voltage VDD1.

As a voltage level of the first node n1 is lower than a threshold voltage level Vth, the reset signal RST is deactivated. Thus, the second node n2 is at a reset-off state. The reset-off state may be a state during which the reset signal RST is deactivated.

As described above, when a voltage level of the first node n1 is insufficiently discharged through a first discharge unit 140, the first node n1 is discharged through the second discharge unit 160.

Figure 5:
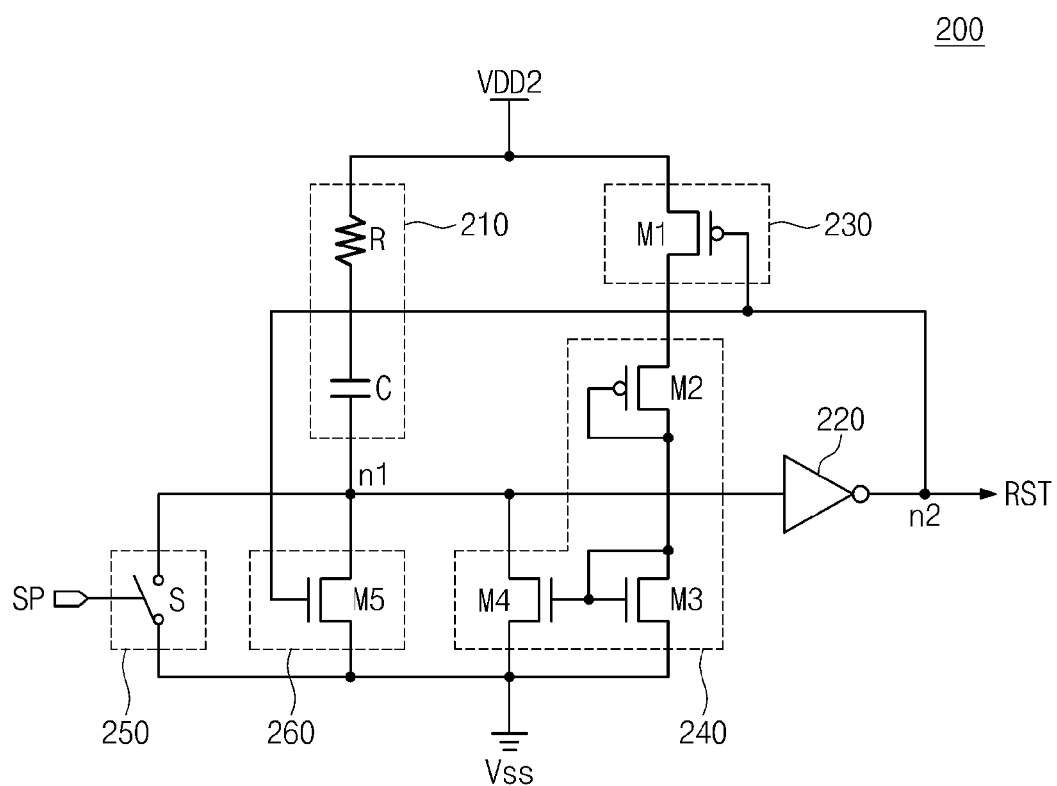
FIG. 5 is a circuit diagram schematically illustrating a power-on reset circuit according to another exemplary embodiment of the present general inventive concept.

FIG. 5 is a circuit diagram schematically illustrating a power-on reset circuit 200 according to another exemplary embodiment of the present general inventive concept. Referring to FIG. 5, the power-on reset circuit 200 includes a voltage detector unit 210, an inverter 220, a first switch unit 230, a first discharge unit 240, a second switch unit 250, and a second discharge unit 260. The power-on reset circuit 200 illustrated in FIG. 5 is substantially the same as that illustrated in FIG. 2, with an exception of the second switch unit 250.

Similar to the power-on reset circuit 100 illustrated in FIG. 2, a leakage current may be continuously applied to a first node n1 through the voltage detector unit 210 according to a strength of a light applied from an external device. Thus, since a voltage level of the first node n1 is not lowered, the inverter 220 continues to activate a reset signal RST.

The second switch unit 250 includes a switch S connected between the first node n1 and a ground terminal Vss. The second switch unit 250 is turned on according to a start pulse signal SP applied from the external device.

The second switch unit 250 discharges a voltage of the first node n1 to the ground terminal Vss in response to the start pulse signal SP. Also, the second discharge unit 260 operates in response to a voltage level of the first node n1 being lower than a threshold voltage level. At this time, a voltage of the first node n1 may be discharged to the ground terminal Vss.

As a voltage level of the first node n1 is lower than the threshold voltage level, the inverter 220 deactivates the reset signal RST. Also, the second switch unit 250 is a transistor having size that is smaller than that of each of first through fifth transistors M1 through M5, respectively.

Figure 6:
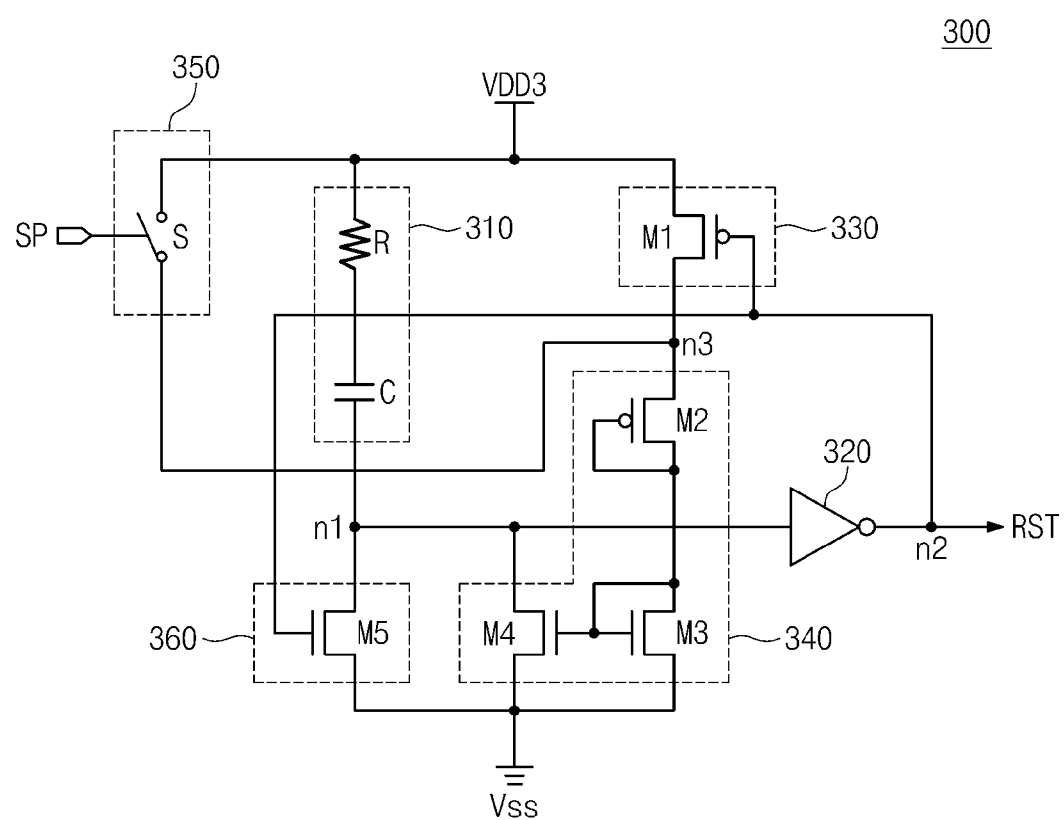
FIG. 6 is a circuit diagram schematically illustrating a power-on reset circuit according to another exemplary embodiment of the present general inventive concept.

FIG. 6 is a circuit diagram schematically illustrating a power-on reset circuit 300 according to another exemplary embodiment of the present general inventive concept. Referring to FIG. 6, the power-on reset circuit 300 includes a voltage detector unit 310, an inverter 320, a first switch unit 330, a first discharge unit 340, a second switch unit 350, and a second discharge unit 360. The power-on reset circuit 300 illustrated in FIG. 6 is substantially the same as that illustrated in FIG. 2, with an exception of the second switch unit 350.

Similar to the power-on reset circuit 100 illustrated in FIG. 2, a leakage current may be continuously applied to a first node n1 through the voltage detector unit 310 according to a strength of a light applied from an external device. Thus, since a voltage level of the first node n1 is not lowered, the inverter 320 continues to activate a reset signal RST. The second switch unit 350 includes a switch S connected between a power supply terminal and a third node n3. The third node n3 may exist between a first transistor M1 and a second transistor M2. The second switch unit 350 is turned on according to a start pulse signal SP applied from the external device.

The second switch unit 350 transfers a third power supply voltage VDD3 from the power supply terminal to the third node n3 in response to the start pulse signal SP. The first discharge unit 340 receives the third power supply voltage VDD3 applied to the third node n3 through the first and second switch units 330 and 350, respectively. The first discharge unit 340 discharges a voltage of the first node n1 to a ground terminal Vss in response to a voltage level of the third node n3.

As compared with such a case during which a voltage is transferred through the first switch unit 330, the third node n3 receives a relatively higher voltage level when a voltage is transferred to the third node n3 through the first and second switch units 330 and 350, respectively. The first discharge unit 340 receives a voltage applied to the third node n3 through the first and second switch units 330 and 350, respectively. A discharge capacity of the first discharge unit 340 is improved according to a voltage level of the third node n3. A voltage of the first node n1 may be smoothly discharged through the first discharge unit 340.

The inverter 320 deactivates the reset signal RST when a voltage level of the first node n1 is lower than the threshold voltage level. Also, the second discharge unit 360 is turned on when a voltage level of the first node n1 is lower than the threshold voltage level. As the second discharge unit 360 is turned on, a voltage of the first node n1 is discharged to the ground terminal Vss.

Figure 7:
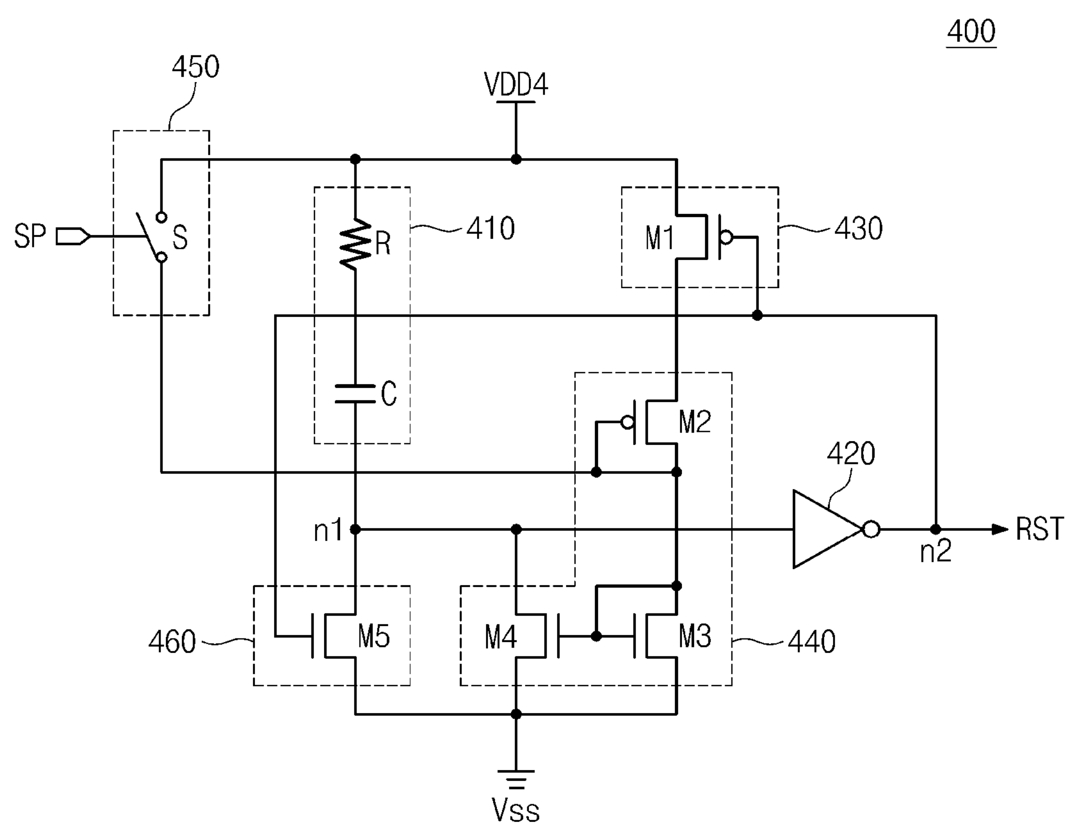
FIG. 7 is a circuit diagram schematically illustrating a power-on reset circuit according to another exemplary embodiment of the present general inventive concept.

FIG. 7 is a circuit diagram schematically illustrating a power-on reset circuit 400 according to another exemplary embodiment of the present general inventive concept. Referring to FIG. 7, the power-on reset circuit 400 includes a voltage detector unit 410, an inverter 420, a first switch unit 430, a first discharge unit 440, a second switch unit 450, and a second discharge unit 460. The power-on reset circuit 400 illustrated in FIG. 7 is substantially the same as that illustrated in FIG. 2, with exception to the second switch unit 450.

Similar to the power-on reset circuit 100 illustrated in FIG. 2, a leakage current may be continuously applied to a first node n1 through the voltage detector unit 410 according to a strength of a light applied from an external device. Thus, since a voltage level of the first node n1 is not lowered, the inverter 420 continues to activate a reset signal RST. The second switch unit 450 includes a switch S connected between a power supply terminal and the first discharge unit 440. The second switch unit 450 is turned on according to a start pulse signal SP applied from the external device.

A second transistor M2 transfers a fourth power supply voltage VDD4 received through the first and second switch units 430 and 450, respectively, to a drain and a gate of a third transistor M3. As compared with such a case during which a voltage is received through the first switch unit 430, the second transistor M2 receives a relatively higher voltage level when a voltage is received through the first and second switch units 430 and 450, respectively. A discharge capacity of a fourth transistor M4 is improved according to a voltage level of the second transistor M2. For example, as a voltage received through the second transistor M2 is relatively higher, the discharge capacity of the fourth transistor M4 is further improved.

Thus, when a voltage is applied to the second transistor M2 through the first and second switch units 430 and 450, respectively, a voltage of the first node n1 is smoothly discharged through the fourth transistor M4.

Also, the inverter 420 deactivates the reset signal RST when a voltage level of the first node n1 is lower than a threshold voltage level. Also, the second discharge unit 460 is turned on when a voltage level of the first node n1 is lower than a threshold voltage level. At this time, a voltage of the first node n1 is discharged to a ground terminal Vss.

Figure 8:
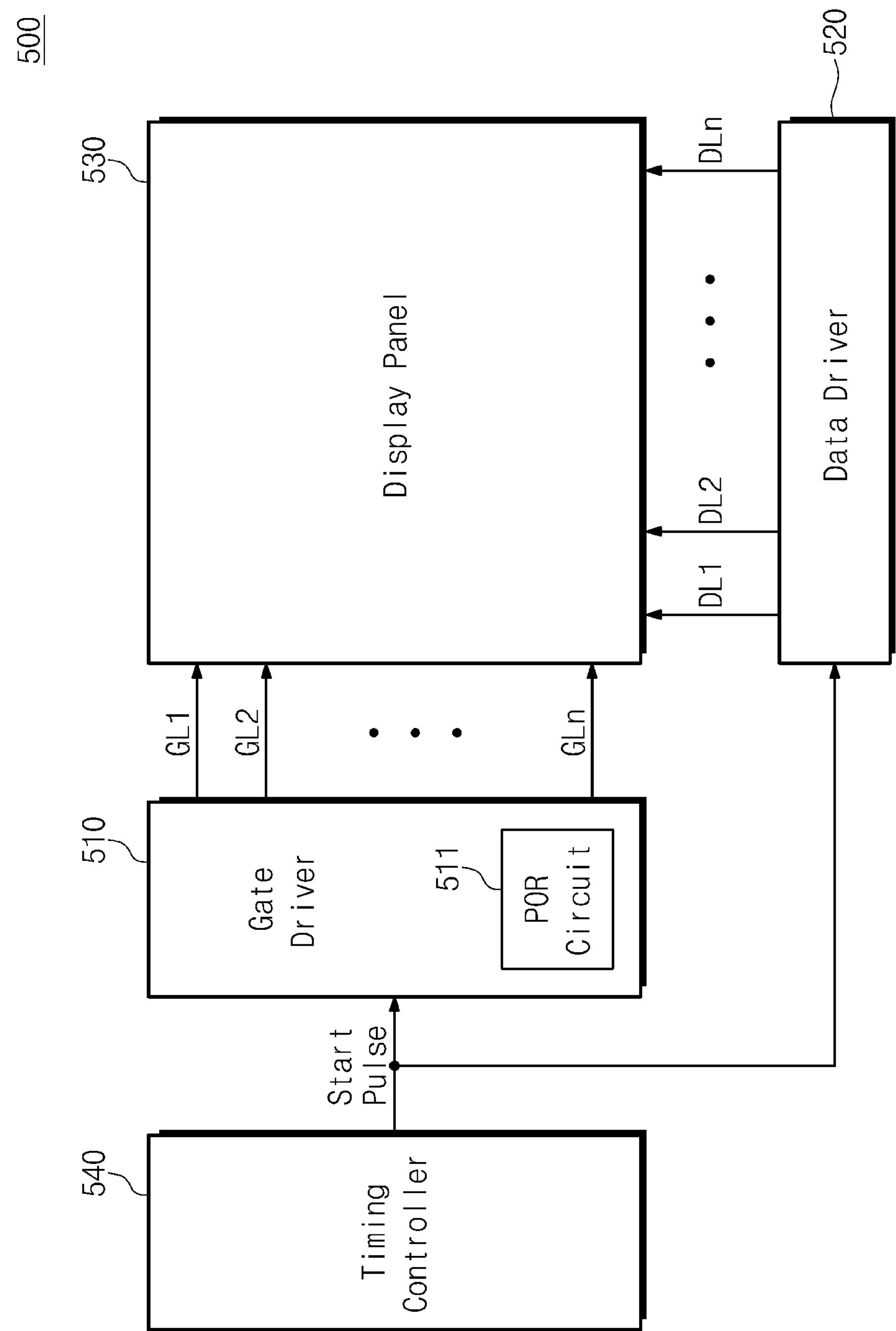
FIG. 8 is a block diagram schematically illustrating a display device according to an exemplary embodiment of the present general inventive concept.

FIG. 8 is a block diagram schematically illustrating a display device 500 according to an exemplary embodiment of the present general inventive concept. Referring to FIG. 8, the display device 500 includes a gate driver 510, a data driver 520, a display panel 530, and a timing controller 540.

The gate driver 510 is electrically connected to the display panel 540 through a plurality of gate lines GL1 through GLn. The gate driver 510 applies gate voltages to the plurality of gate lines GL1 through GLn. The gate driver 510 includes a power-on reset circuit 511. The power-on reset circuit 511 may be a power-on reset circuit described with reference to FIGS. 2 and 4 through 7.

The data driver 520 is electrically connected to the display panel 540 through a plurality of data lines DL1 through DLn. The data driver 520 applies data voltages to the plurality of data lines DL1 through DLn.

The display panel 530 is electrically connected to the gate driver through the plurality of gate lines GL1 through GLn. The display panel 530 is electrically connected to the data driver 520 through the plurality of data lines DL1 through DLn. The display panel 530 may include a plurality of pixels arranged in a matrix form. Each pixel operates a gate voltage provided from the gate driver 510 and a data voltage provided from the data driver 520.

The power-on reset circuit 511 included in the gate driver 510 activates a reset signal RST to reset the gate driver 510.

The timing controller 540 is electrically connected to the gate driver 510 and the data driver 520. The timing controller 540 provides the gate driver 510 with a control signal needed to generate the gate voltage. The timing controller 540 provides the gate driver 510 with a start pulse signal SP as an initial signal of the control signal.

The timing controller 540 generates the start pulse signal SP to output it to the gate driver 510. The power-on reset circuit 511 deactivates the reset signal RST in response to the start pulse signal SP. Thus, a reset operation of the gate driver 510 ends.

Figure 9:
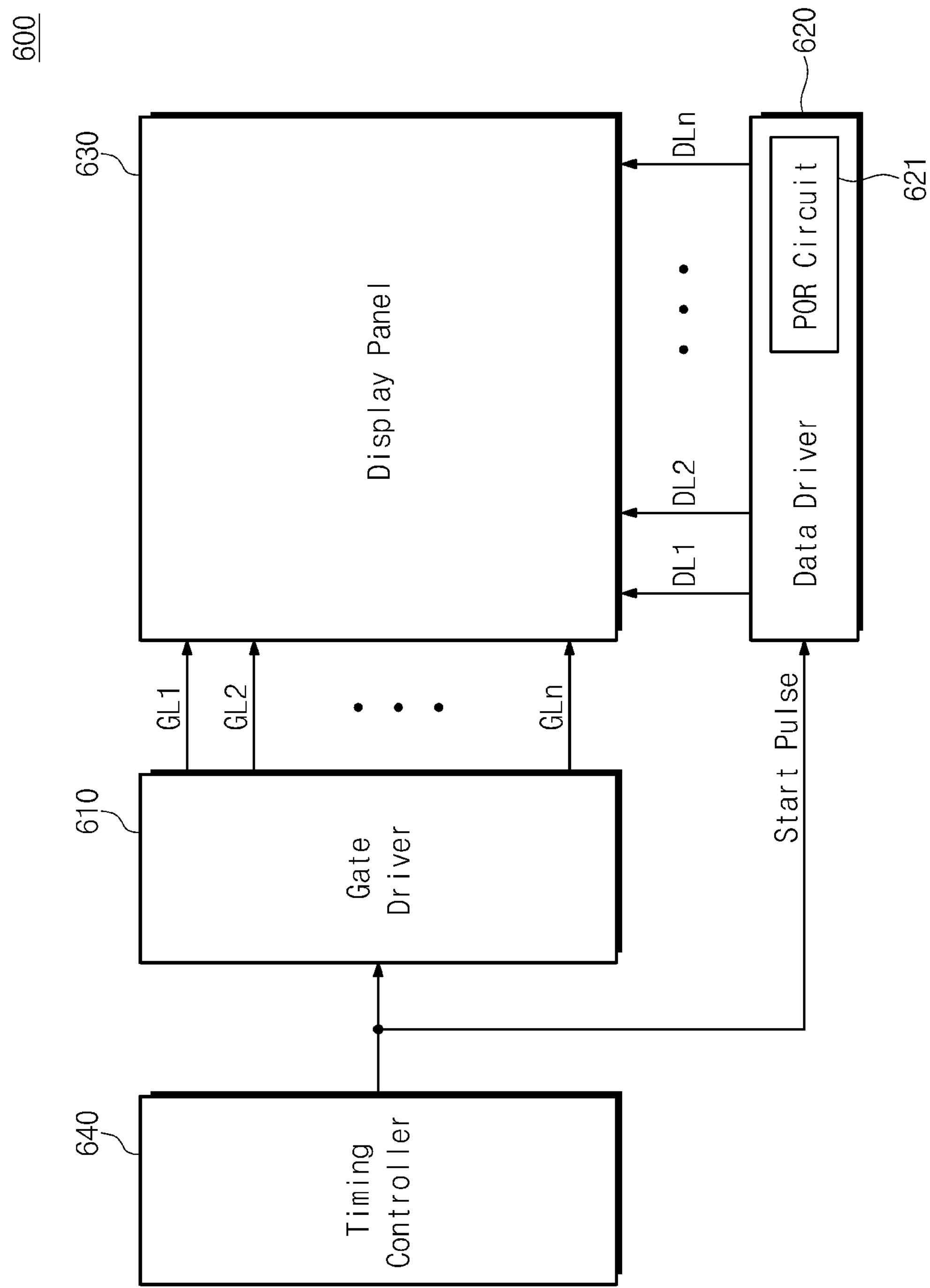
FIG. 9 is a block diagram schematically illustrating a display device according to another exemplary embodiment of the present general inventive concept.

FIG. 9 is a block diagram schematically illustrating a display device 600 according to another exemplary embodiment of the present general inventive concept. Referring to FIG. 9, the display device 600 includes a data driver 620 including a power-on reset circuit 621. The power-on reset circuit 621 illustrated in FIG. 9 is a power-on reset circuit described with reference to FIGS. 2 and 4 through 7.

The power-on reset circuit 621 included in the data driver 621 activates a reset signal RST to reset the data driver 620.

A timing controller 640 is electrically connected to a gate driver 610 and the data driver 620. The timing controller 640 generates a start pulse signal SP and outputs it to the data driver 620. The power-on reset circuit 621 deactivates the reset signal RST in response to the start pulse signal SP.

As described above, exemplary embodiments of the present general inventive concept include a power-on reset circuit that is supplied with a start pulse signal SP through a timing controller. The power-on reset circuit controls a reset signal RST in response to the start pulse signal SP. Thus, although a strength of external light received from outside or an external device may be strong, a display device operates normally.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A power-on reset circuit, comprising:

a voltage detector unit to output an electrical signal in response to a power supply voltage received from a power supply terminal;

an inverter to output a reset signal according to a level of the electrical signal from the voltage detector unit;

a first switch unit to be turned on or off in response to the reset signal from the inverter;

a first discharge unit to discharge the electrical signal in response to the power supply voltage from the first switch unit;

a second switch unit including a first end and a second end to be turned on according to a start pulse signal from an external device, to receive the power supply voltage from the power supply terminal through the first end, and to transfer the received power supply voltage to the second end; and a second discharge unit to discharge the electrical signal in response to the power supply voltage from the second end of the second switch unit, wherein the second end of the second switch unit is directly connected to an output terminal of the inverter.

2. The power-on reset circuit of claim 1, wherein the first switch unit comprises:

a first PMOS transistor connected between the power supply terminal and the first discharge unit and having a gate connected to the output terminal of the inverter.

3. The power-on reset circuit of claim 2, wherein the first PMOS transistor is turned on when the reset signal is activated and is turned off when the reset signal is inactivated.

4. The power-on reset circuit of claim 1, wherein the first discharge unit comprises:

a current mirror to discharge the electrical signal in response to the power supply voltage from the first switch unit.

5. The power-on reset circuit of claim 4, wherein the current mirror comprises:

a source unit to generate a first current in response to the power supply voltage from the first switch unit; and a first NMOS transistor to discharge the electrical signal in response to the first current.

6. The power-on reset circuit of claim 5, wherein the second discharge unit comprises:

a second NMOS transistor to discharge the electrical signal in response to the power supply voltage from the second switch unit, and wherein a size of the second NMOS transistor is larger than that of the first NMOS transistor.

7. The power-on reset circuit of claim 6, wherein the second NMOS transistor has a drain terminal directly connected to the voltage detector unit, a source terminal grounded, and a gate terminal connected to the second switch unit.

8. The power-on reset circuit of claim 1, wherein when a voltage level of the electrical signal applied to the inverter is higher than a threshold voltage level, the inverter activates the reset signal.

9. The power-on reset circuit of claim 1, wherein the start pulse signal is applied to the second switch unit after the reset signal output from the inverter is activated.

10. The power-on reset circuit of claim 9, wherein when the second switch unit is turned on in response to the start pulse signal, the power supply voltage is applied to the output terminal of the inverter through the second switch unit.

11. A power-on reset circuit to activate a reset signal to reset a display device, the power-on reset circuit comprising:

an inverter to activate the reset signal in response to a received electrical signal corresponding to a power supply voltage, such that the display device is reset;

a first switch unit to turn on in response to receiving the reset signal from the inverter;

a first discharge unit to discharge the electrical signal in response to receiving the power supply voltage from the first switch unit;

a second switch unit including a first end and a second end to be turned on according to a start pulse signal from an external device, to receive the power supply voltage from the power supply terminal through the first end, and to transfer the received power supply voltage to the second end; and a second discharge unit to receive the power supply voltage from the second end of the second switch unit in response to the start pulse signal and to discharge the electrical signal to deactivate the reset signal, wherein the second end of the second switch unit is directly connected to an output terminal of the inverter.

12. The power-on reset circuit of claim 11, further comprising:

a voltage detector unit to receive the power supply voltage from a power supply terminal and to output the electrical signal to a first node connected to an input of the inverter.

13. The power-on reset circuit of claim 12, wherein the reset signal is deactivated when a voltage level of the first node is less than a threshold level.

14. The power-on reset circuit of claim 11, wherein the inverter activates the reset signal when a voltage level of the received electrical signal is higher than a threshold voltage level.

15. The power-on reset circuit of claim 11, wherein the first discharge unit receives the power supply voltage when the first switch unit is turned on.

16. The power-on reset circuit of claim 11, further comprising:

a second switch unit to turn on in response to the start pulse signal received from the external device and to supply the power supply voltage to the second discharge unit.

* * * * *